United States Patent
Daubenspeck et al.

(10) Patent No.: US 7,517,789 B2
(45) Date of Patent: Apr. 14, 2009

(54) SOLDER BUMPS IN FLIP-CHIP TECHNOLOGIES

(75) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/869,787

(22) Filed: Oct. 10, 2007

(65) Prior Publication Data

US 2008/0023833 A1    Jan. 31, 2008

Related U.S. Application Data

(63) Continuation of application No. 10/908,083, filed on Apr. 27, 2005, now Pat. No. 7,329,951.

(51) Int. Cl.
*H01L 21/44* (2006.01)
(52) U.S. Cl. .................. 438/613; 438/614
(58) Field of Classification Search .......... None
See application file for complete search history.

(56) References Cited

U.S. PATENT DOCUMENTS

| 5,877,078 | A  | 3/1999  | Yanagida |
| 6,426,281 | B1 | 7/2002  | Lin et al. |
| 6,593,220 | B1 | 7/2003  | Yu et al. |
| 6,756,294 | B1 | 6/2004  | Chen et al. |
| 6,964,915 | B2 | 11/2005 | Farnworth et al. |
| 2004/0182915 | A1 | 9/2004 | Bachman et al. |
| 2006/0043364 | A1 | 3/2006 | Jiang et al. |

*Primary Examiner*—Evan Pert
*Assistant Examiner*—Ben P Sandvik
(74) *Attorney, Agent, or Firm*—Schmeiser, Olsen & Watts; William D. Sabo (57) ABSTRACT

A solder bump structure and method for forming the same. The structure includes (a) a dielectric layer including a dielectric layer top surface (b) an electrically conductive bond pad on and in direct physical contact with the dielectric layer top surface; (c) a patterned support/interface layer on the dielectric layer top surface and thicker than the electrically conductive bond pad in the reference direction, wherein the patterned support/interface layer includes a hole and a trench, wherein the hole is directly above the electrically conductive bond pad, and wherein the trench is not filled by any electrically conductive material; and (d) an electrically conductive solder bump filling the hole and electrically coupled to the electrically conductive bond pad.

3 Claims, 12 Drawing Sheets

SOLDER BUMPS IN FLIP-CHIP TECHNOLOGIES

This application is a continuation application claiming priority to Ser. No. 10/908,083, filed Apr. 27, 2005.

BACKGROUND OF THE INVENTION

1. Technical Field

The present invention relates to solder bump structures in flip-chip technologies, and more specifically, to solder bump structures that facilitate good bonding of a chip to a package/substrate.

2. Related Art

In flip-chip technologies, solder bumps are typically formed on top of a semiconductor chip (i.e., integrated circuit IC). Each solder bump is formed directly on an aluminum bond pad of the chip. The chip is then flipped face down and then aligned to a package/substrate. The solder bumps are bonded directly, simultaneously, and one-to-one to the pads of the package/substrate (called package/substrate pads). After that, an adhesive underfill material is used to fill the empty space between the chip and the package/substrate. Once in place, the adhesive underfill material is cured at a high temperature so as to become a solid underfill layer tightly bonding the chip to the package/substrate. The quality of the chip depends in part on the quality of the bonding of the chip to the package/substrate.

Therefore, there is a need for a solder bump structure that facilitates good bonding of a chip to a package/substrate.

SUMMARY OF THE INVENTION

The present invention provides a structure, comprising (a) a dielectric layer including a dielectric layer top surface that defines a reference direction essentially perpendicular to the dielectric layer top surface; (b) an electrically conductive bond pad on and in direct physical contact with the dielectric layer top surface; (c) a patterned support/interface layer on the dielectric layer top surface and thicker than the electrically conductive bond pad in the reference direction, wherein the patterned support/interface layer comprises a hole and a trench, wherein the hole is directly above the electrically conductive bond pad, and wherein the trench is not filled by any electrically conductive material; and (d) an electrically conductive solder bump filling the hole and electrically coupled to the electrically conductive bond pad.

The present invention also provides a structure, comprising (a) a dielectric layer including a dielectric layer top surface that defines a reference direction essentially perpendicular to the dielectric layer top surface; (b) an electrically conductive bond pad on and in direct physical contact with the dielectric layer top surface; (c) a patterned support/interface layer on the dielectric layer top surface and thicker than the electrically conductive bond pad in the reference direction, wherein the patterned support/interface layer comprises a hole directly above the electrically conductive bond pad; (d) an electrically conductive solder bump filling the hole and electrically coupled to the electrically conductive bond pad; and (e) a bump limiting metallurgy (BLM) film physically isolating the electrically conductive solder bump and the electrically conductive bond pad, wherein the BLM film comprises a first electrically conductive material, wherein the electrically conductive solder bump comprises a second electrically conductive material different from the first electrically conductive material, and wherein the BLM film physically isolates the patterned support/interface layer and the dielectric layer.

The present invention also provides a structure formation method, comprising providing (a) a dielectric layer including a dielectric layer top surface that defines a reference direction essentially perpendicular to the dielectric layer top surface, and (b) an electrically conductive bond pad on and in direct physical contact with the dielectric layer top surface; forming a bump limiting metallurgy (BLM) film on the electrically conductive bond pad and the dielectric layer top surface; forming a patterned support/interface layer on the BLM film, wherein the patterned support/interface layer comprises a hole directly above the electrically conductive bond pad such that the BLM film is exposed to a surrounding ambient through the hole; and forming an electrically conductive solder bump in the hole and in direct physical contact with the BLM film, wherein the electrically conductive solder bump has a top point at a level higher than a top surface of the patterned support/interface layer.

The present invention provides a solder bump structure that facilitates good bonding of a chip to a package/substrate.

DETAILED DESCRIPTION OF THE INVENTION

FIGS. 1A-1E illustrate the fabrication of a first solder bump structure 100, in accordance with embodiments of the present invention. More specifically, with reference to FIG. 1A, in one embodiment, the fabrication of the structure 100 starts with (i) a dielectric layer 110 at top of a semiconductor chip (not shown for simplicity) and (ii) an electrically conductive line 120 (comprising copper (Cu) in one embodiment) embedded in the dielectric layer 110. It should be noted that the Cu line 120 is a part of a top interconnect layer (not shown) of the semiconductor chip. There may be additional interconnect layers beneath and electrically coupled to the top interconnect layer, but these additional interconnect layers are not shown for simplicity.

Figure 1A:
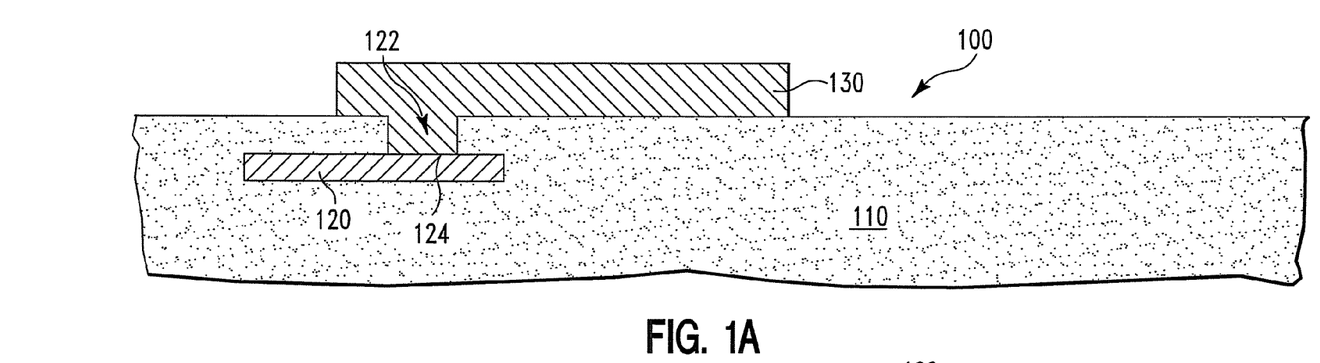
FIGS. 1A-1E illustrate the fabrication of a first solder bump structure, in accordance with embodiments of the present invention.

Next, in one embodiment, a portion of the dielectric layer 110 is removed so as to create a hole 122 such that a top surface 124 of the Cu line 120 is exposed to the surrounding ambient.

Next, in one embodiment, a bond pad 130 (comprising aluminum (Al) in one embodiment) is formed on top of the Cu line 120 and the dielectric layer 110 such that the Al bond pad 130 is electrically coupled to the Cu line 120. Illustratively, the Al bond pad 130 can be formed by (a) forming an Al layer (not shown) on the entire structure 100, then (b) directionally and selectively etching back the Al layer stopping at the dielectric layer 110. The directional and selective etching in step (b) may be performed using a traditional lithographic process such that what remains of the Al layer after the etching is the Al bond pad 130.

Figure 1B:
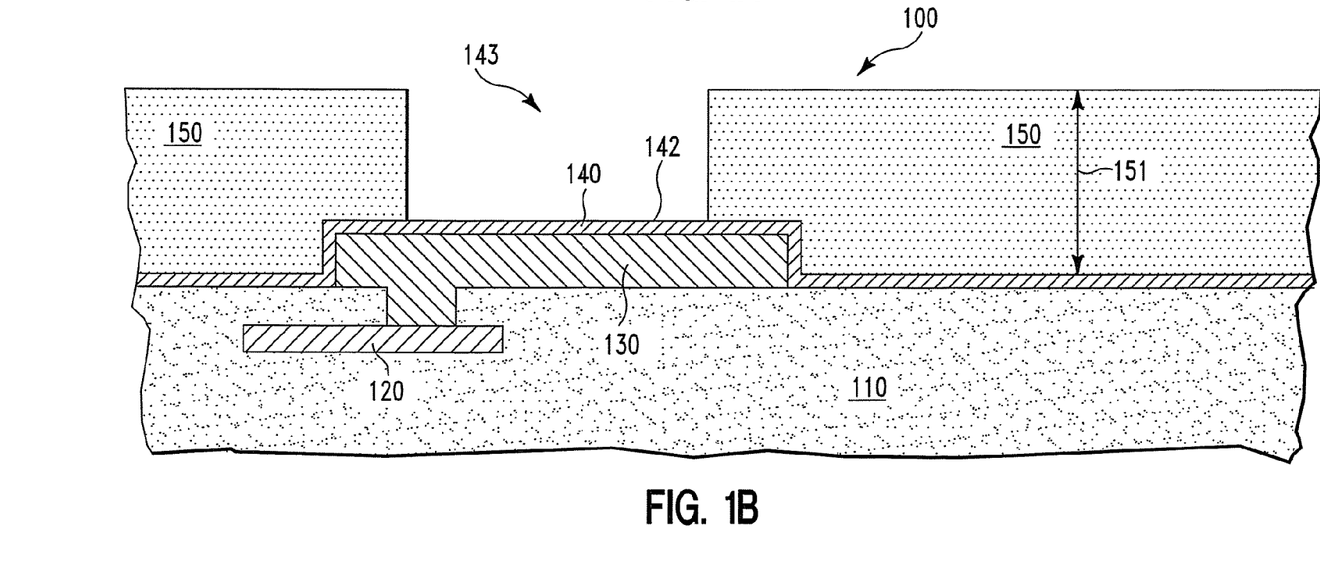

Next, with reference to FIG. 1B, in one embodiment, a bump limiting metallurgy (BLM) film 140 is formed on top of the entire structure 100 of FIG. 1A by, illustratively, sputter deposition. Illustratively, the BLM film 140 comprises multiple layers of copper (Cu), chrome (Cr), and gold (Au).

Next, in one embodiment, a patterned support/interface layer 150 (comprising polyimide and having a thickness 151 in a range of 30-50 μm in one embodiment) is formed on top of the BLM film 140. In one embodiment, the patterned support/interface layer 150 comprises a hole 143 such that a top surface 142 of the BLM film 140 directly above the Al bond pad 130 is exposed to the surrounding ambient via the hole 143.

In one embodiment, the patterned support/interface layer 150 is formed using a photosensitive method. More specifically, the patterned support/interface layer 150 is formed by (i) spin-applying a polyimide film (not shown) on the structure 100 right after the BLM film 140 is formed, (ii) then curing the polyimide film at a high temperature, (iii) then exposing the polyimide film to light through a mask (not shown) in a photo stepper lithographic tool (not shown), (iv) and then developing the polyimide film so as to form the patterned support/interface layer 150. It should be noted that polyimide is a photosensitive polymer. In general, other photosensitive polymers may be used instead of polyimide.

Figure 1C:
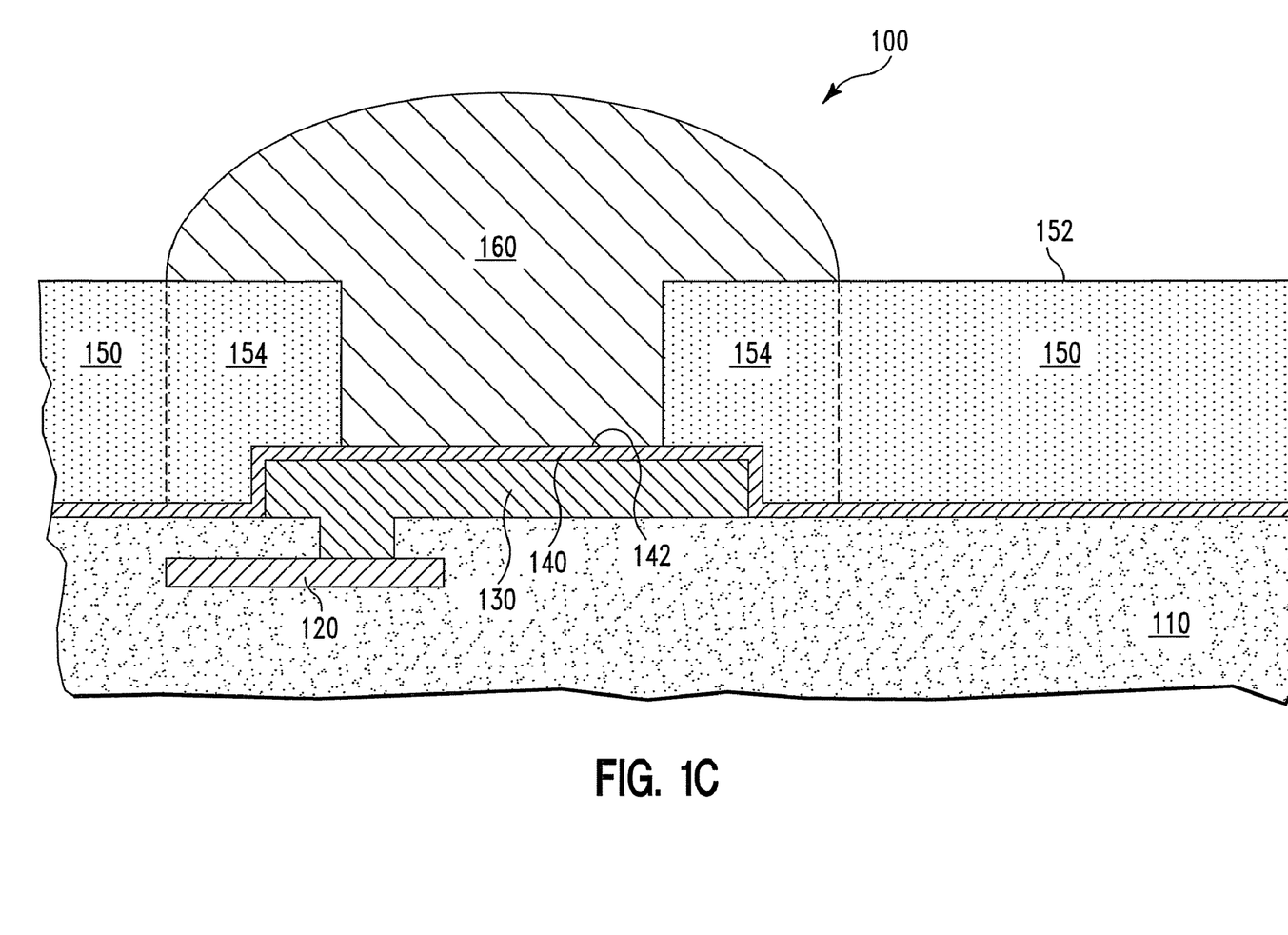

Next, with reference to FIG. 1C, in one embodiment, a solder bump 160 (comprising lead (Pb) and tin (Sn) in one embodiment) is formed on the top surface 142 of the BLM film 140 by, illustratively, electroplating. More specifically, illustratively, the structure 100 is submerged in a solution (not shown) containing copper ions (e.g., a solution of copper sulfate $CuSO_4$ and sulfuric acid $H_2SO_4$). The BLM film 140 is electrically coupled to the cathode of an external dc (direct current) power supply (not shown), while the solution is electrically coupled to the anode of the dc supply. Under the electric field created in the solution by the dc power supply, copper ions in the solution arrive at the exposed surface 142 of the BLM film 140 and deposit there forming the solder bump 160.

In one embodiment, the solder bump 160 is grown exceeding a top surface 152 of the patterned support/interface layer 150 such that there exists a portion 154 of the patterned support/interface layer 150 directly underneath the solder bump 160. In one embodiment, the solder bump 160 has a shape of a mushroom, and the portion 154 has the shape of a ring being directly beneath the mushroom hat.

Figure 1D:
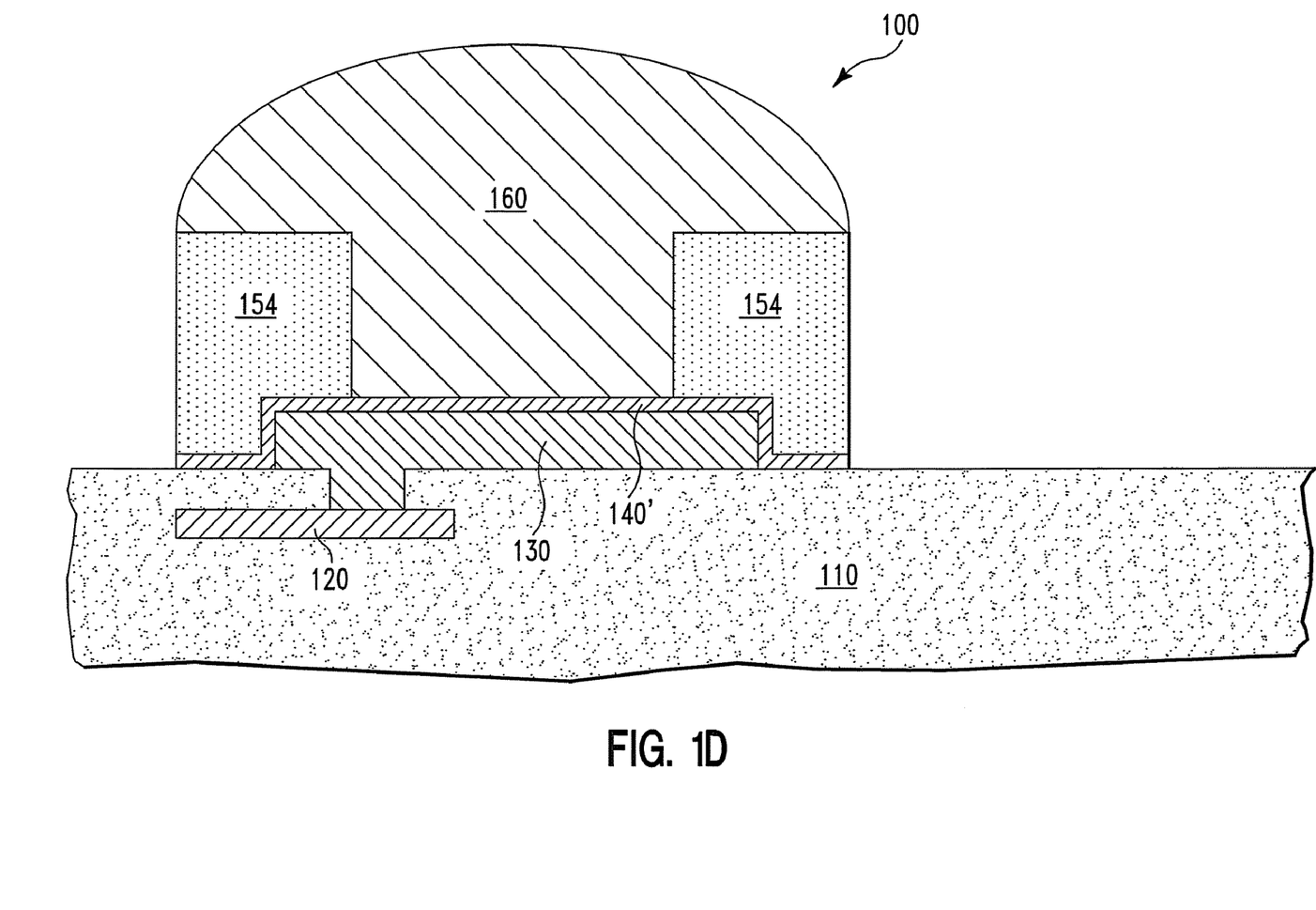

Next, with reference to FIG. 1D, in one embodiment, the solder bump 160 is used as a blocking mask for directionally etching the patterned support/interface layer 150 and then the BLM film 140 stopping at the dielectric layer 110. What remains of the patterned support/interface layer 150 and the BLM film 140 (FIG. 1C) after the directional etch are the polyimide support/interface portion 154 and a BLM film 140', respectively.

Figure 1E:
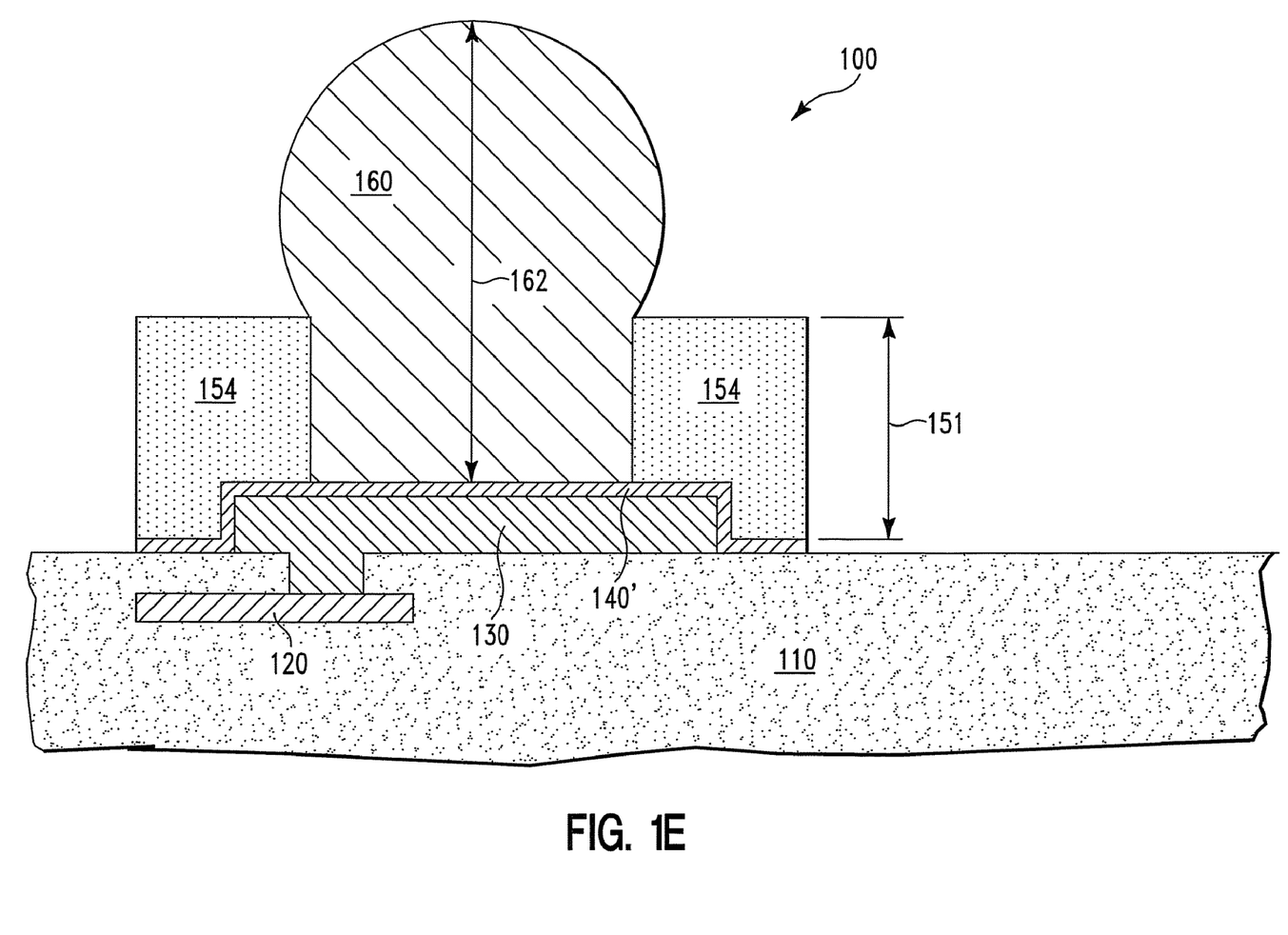

Next, with reference to FIG. 1E, in one embodiment, the solder bump 160 is reflowed so as to have a spherical shape at its top portion. Illustratively, the solder bump 160 of FIG. 1D is reflowed by subjecting it to a temperature lower than 400° C. In one embodiment, the resulting solder bump 160 has a height 162 in a range of 100-125 μm. In one embodiment, the thickness 151 of the polyimide support/interface portion 154 is at least ⅓ (one third) of the thickness 162 of the solder bump 160.

Figure 2A:
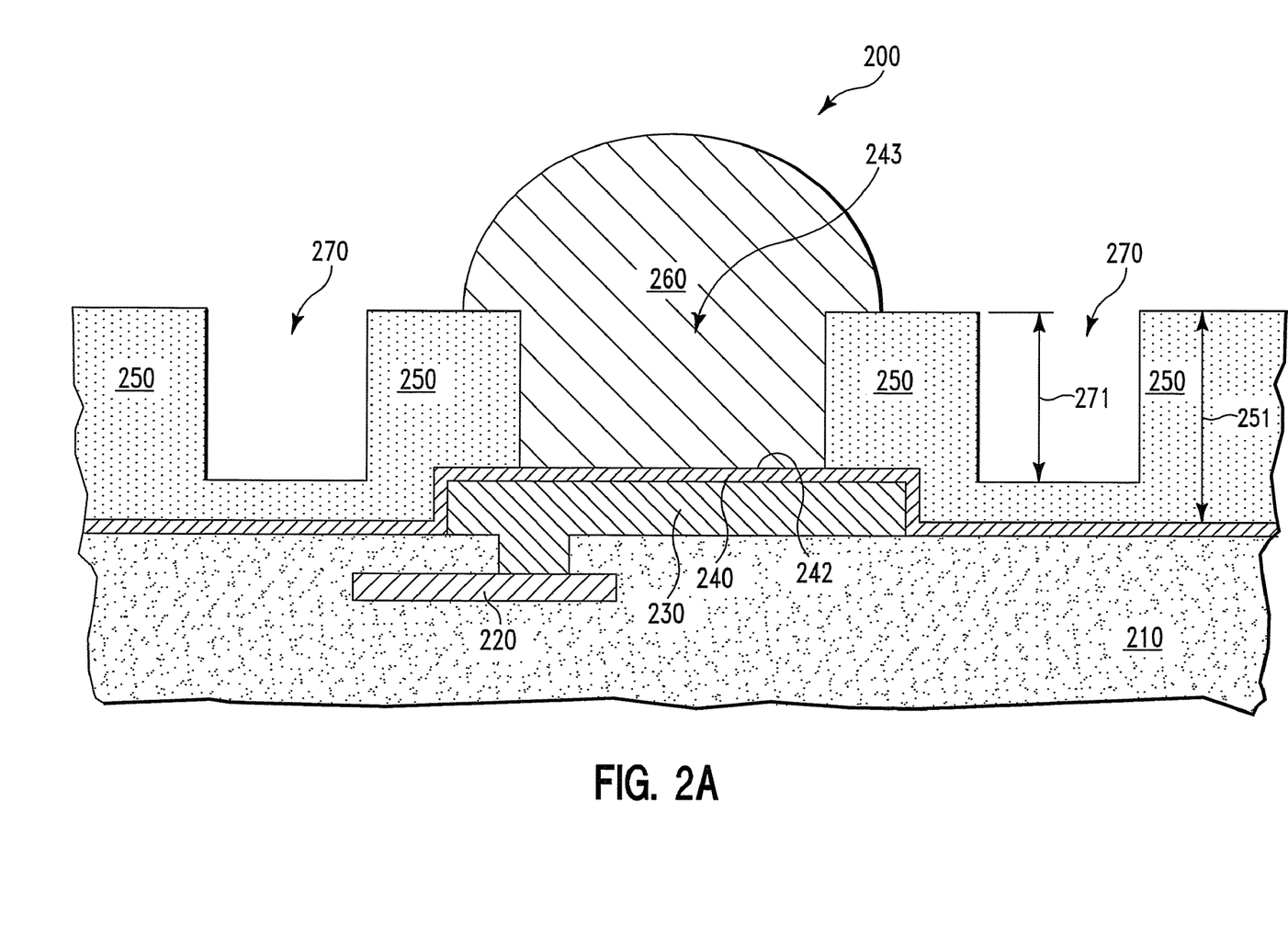
FIGS. 2A-2C illustrate the fabrication of a second solder bump structure, in accordance with embodiments of the present invention.
Figure 2B:
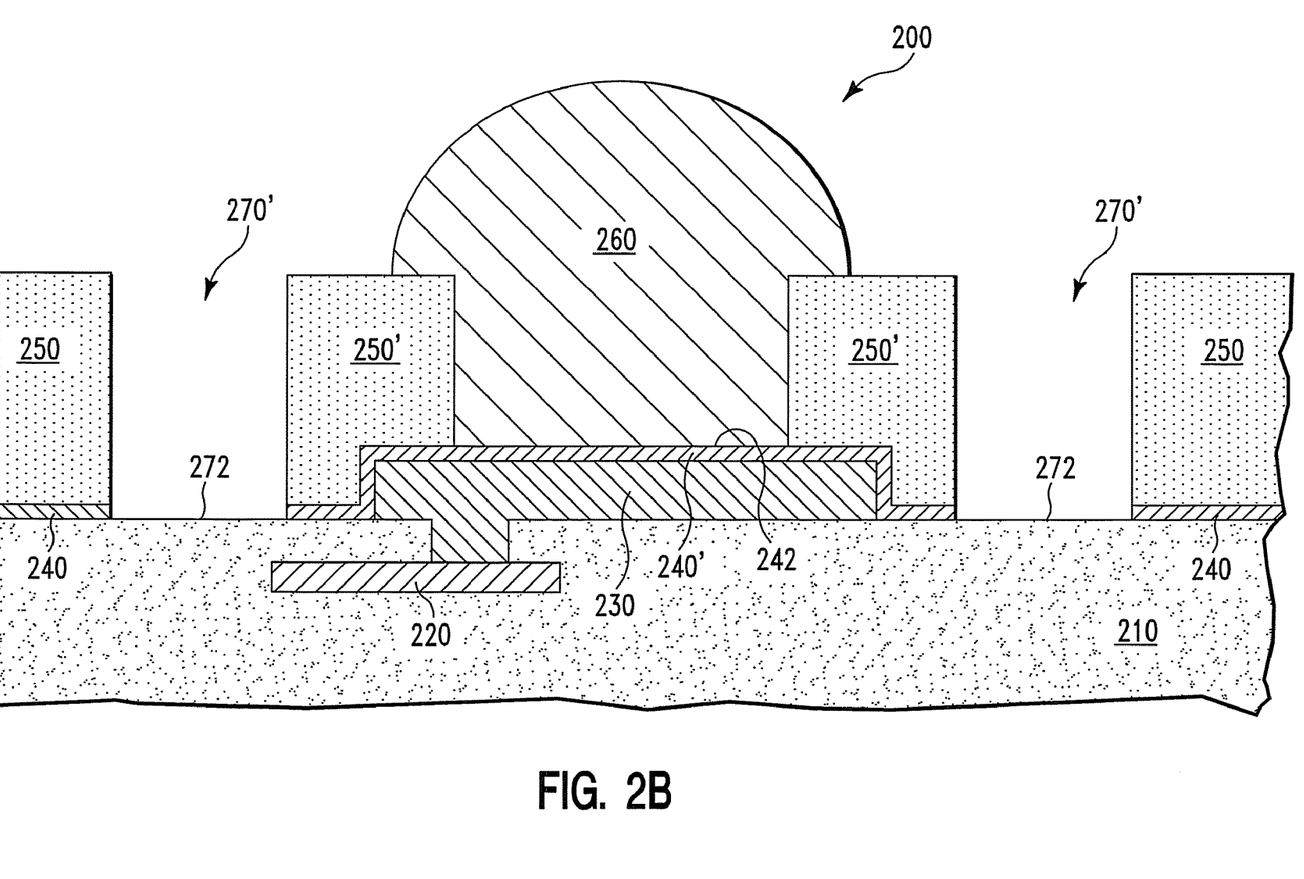
Figure 2C:
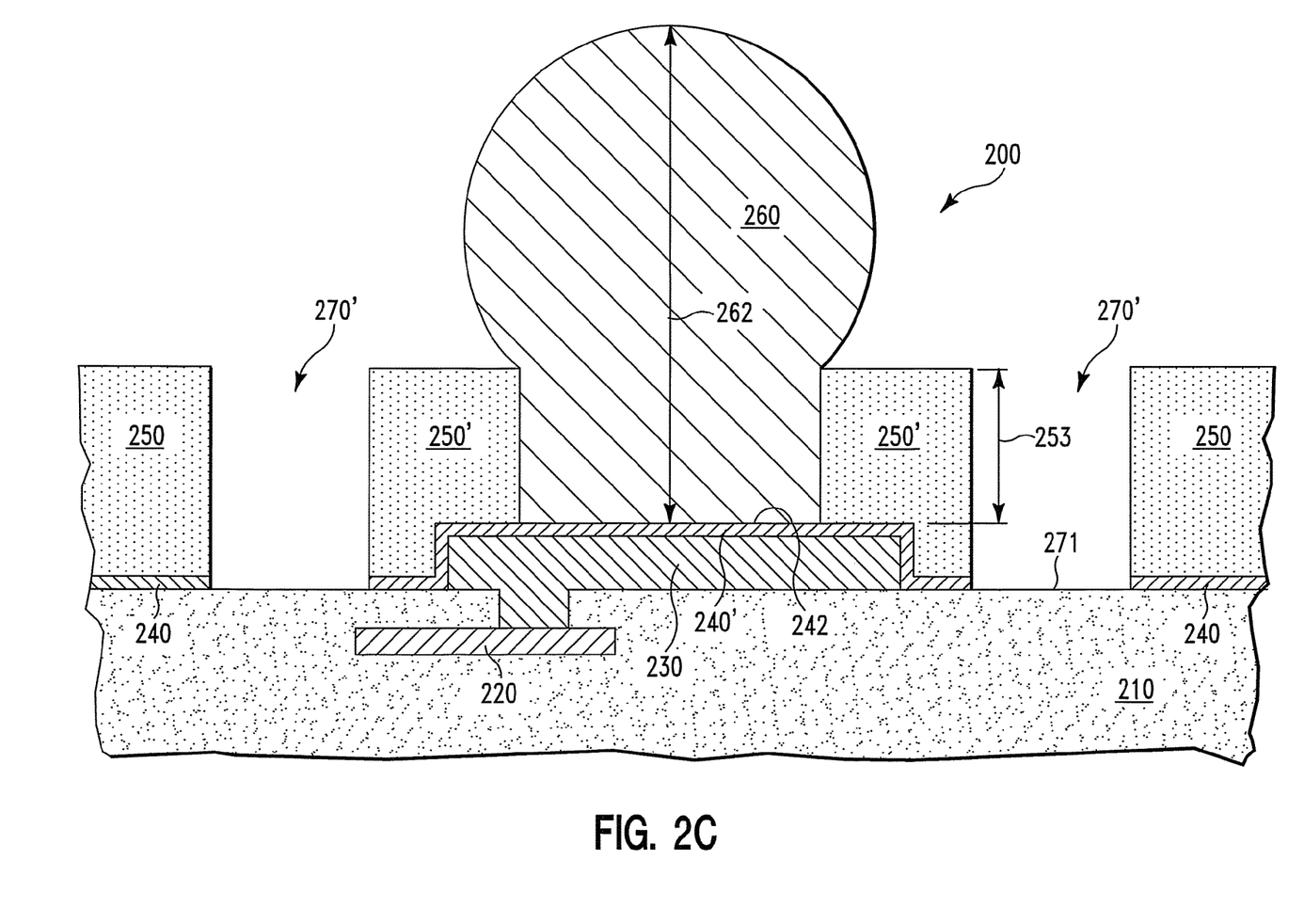

FIGS. 2A-2C illustrate the fabrication of a second solder bump structure 200, in accordance with embodiments of the present invention. More specifically, with reference to FIG. 2A, in one embodiment, the fabrication of the structure 200 starts with a structure 210,220,230,240 similar to the structure 100 of FIG. 1B (without the patterned support/interface layer 150). More specifically, the structure 210,220,230,240 comprises (i) a dielectric layer 210, (ii) a Cu line 220 embedded in the dielectric layer 210, (iii) an Al bond pad 230 on top the Cu line 220, and (iv) a BLM film 240 on top of the Al bond pad 230 and the dielectric layer 210. It should be noted that the same reference numerals (except the first digit which is used for figure number) are used for similar regions herein.

Next, in one embodiment, a patterned support/interface layer 250 (comprising polyimide and having a thickness 251 in a range of 30-50 μm in one embodiment) is formed on top of the BLM film 240. In one embodiment, the patterned support/interface layer 250 comprises a hole 243 such that a top surface 242 of the BLM film 240 directly above the Al bond pad 230 is exposed to the surrounding ambient via the hole 243.

In one embodiment, the patterned support/interface layer 250 further comprises a trench 270 having a depth 271 smaller than the thickness 251 of the patterned support/interface layer 250 such that portions of the BLM film 240 directly underneath the trench 270 are not exposed to the surrounding ambient.

In one embodiment, the patterned support/interface layer 250 with the hole 243 and the trench 270 is formed by first depositing a polyimide layer (not shown) on top of the entire structure 200 (after the BLM film 240 is formed). Next, the polyimide layer is exposed to light through a special mask (not shown) such that (i) regions of the polyimide layer to remain unchanged are not subjected to the light, (ii) regions of the polyimide layer to be completely removed later (i.e., the polyimide region directly above the Al bond pad 130) are subjected to the light with the highest strength, and (iii) regions of the polyimide layer to be partially removed (i.e., where the trench 270 is later created) are subjected to the light with the weaker strength than the highest strength. Finally, the polyimide layer is developed (i.e., etched by a developer) so as to form the patterned support/interface layer 250. It should be noted that because different regions of the patterned support/interface layer 250 were exposed to the light at different strengths, the regions were developed (i.e., etched) at different rates resulting in the patterned support/interface layer 250 with the hole 243 and the trench 270.

In the embodiments described above, the polyimide layer (which eventually becomes the patterned support/interface layer 250) comprises a photosensitive polymer that becomes more etchable (by a developer) when being exposed to light with higher strength (i.e., positive acting photo system). Alternatively, the polyimide layer (which eventually becomes the patterned support/interface layer 250) comprises a photosensitive polymer that becomes less etchable (by a developer) when being exposed to light with higher strength (i.e., negative acting photo system). In this negative acting photo system, the polyimide layer should be exposed to light through a special mask (not shown) such that (i) regions of the polyimide layer to remain unchanged are subjected to the light with the highest strength, (ii) regions of the polyimide layer to be completely removed later (i.e., the polyimide region directly above the Al bond pad 130) are not subjected to the light, and (iii) regions of the polyimide layer to be partially removed (i.e., where the trench 270 is later created) are subjected to the light with the weaker strength than the highest strength.

Next, in one embodiment, a solder bump 260 (comprising lead (Pb) and tin (Sn) in one embodiment) is formed on the top surface 242 of the BLM film 240 by, illustratively, electroplating. Illustratively, the formation of the solder bump 260 is similar to the formation of the solder bump 160 of FIG. 1C.

Next, with reference to FIG. 2B, in one embodiment, a directional etching process is performed to etch the patterned support/interface layer 250 and then the BLM film 240 in the trench 270 (FIG. 2A) so as to make the trench 270 (FIG. 2A) deeper such that a top surface 272 of the dielectric layer 110 becomes the bottom wall 272 of the resultant trench 270'. In one embodiment, the resultant trench 270' is created surrounding the solder bump 260 such that a BLM film 240' (a portion of the BLM film 240) directly beneath the solder bump 260 becomes physically and electrically isolated from the rest of the BLM film 240. Also as a result of the formation of the trench 270', a bump support region 250' (a portion of the patterned support/interface layer 250) becomes physically isolated from the rest of the patterned support/interface layer 250.

Next, with reference to FIG. 2C, in one embodiment, the solder bump 260 is reflowed so as to have a spherical shape at its top portion. Illustratively, the solder bump 260 of FIG. 2B is reflowed by subjecting it to a temperature lower than 400° C. In one embodiment, the resultant solder bump 260 has a height 262 in a range of 100-125 μm, and the bump support region 250' has a height 253 in a range of 30-50 μm. In one embodiment, the height 253 of the bump support region 250' is at least ⅓ the height 262 of the resultant solder bump 260.

FIGS. 3A-3D illustrate the fabrication of a third solder bump structure 300, in accordance with embodiments of the present invention. More specifically, with reference to FIG. 3A, in one embodiment, the fabrication of the structure 300 starts with a structure 310,320,330 similar to the structure 100 of FIG. 1A. More specifically, the structure 310,320,330 comprises (i) a dielectric layer 310, (ii) a Cu line 320 embedded in the dielectric layer 310, (iii) and an Al bond pad 330 on top the Cu line 220.

Figure 3A:
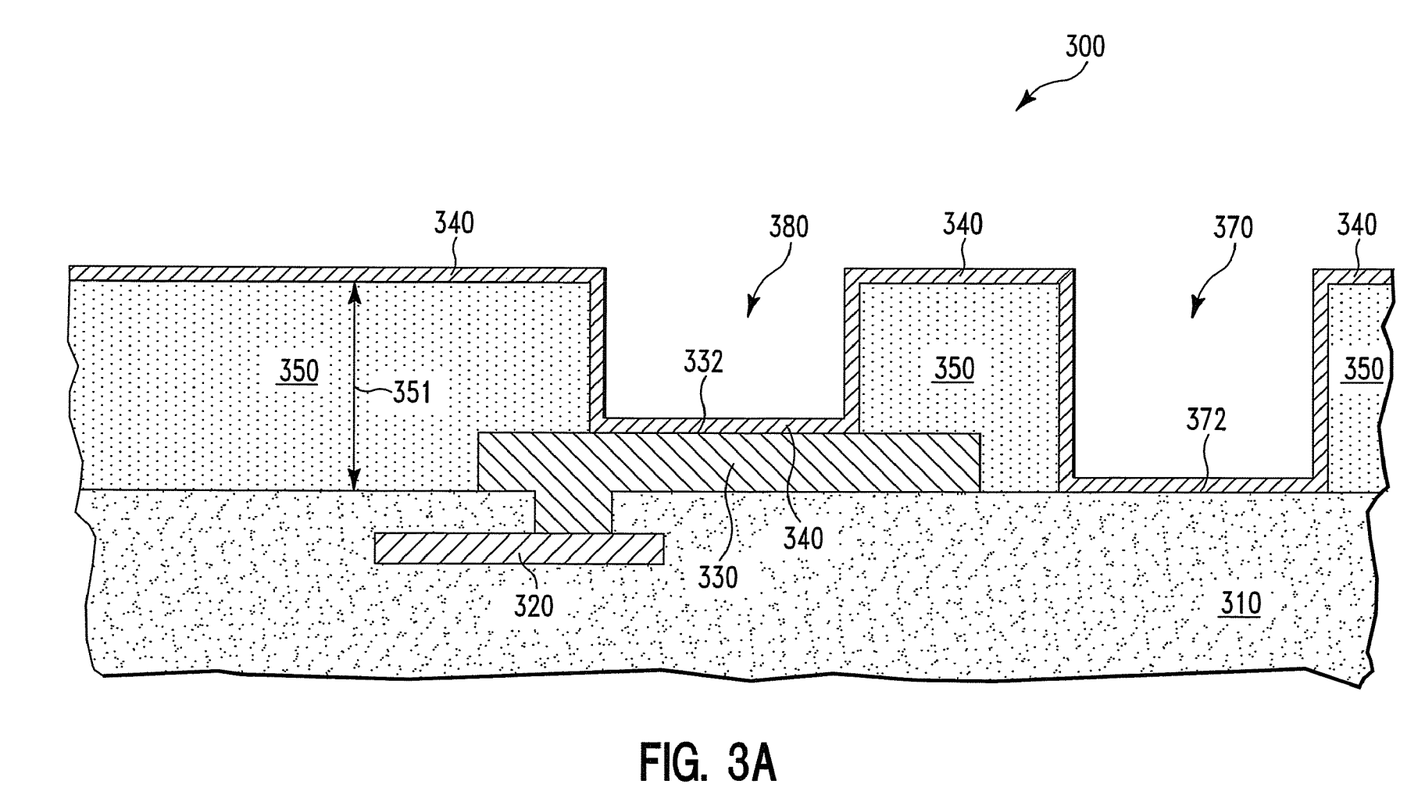
FIGS. 3A-3E illustrate the fabrication of a third solder bump structure, in accordance with embodiments of the present invention.

Next, in one embodiment, a patterned support/interface layer 350 (comprising polyimide and having a thickness 351 in a range of 30-50 μm in one embodiment) is formed on top of the structure 300 by, illustratively, a photo lithographic process. The patterned support/interface layer 350 comprises a hole 380 such that a top surface 332 of the Al bond pad 330 is exposed to the surrounding ambient via the hole 380. The patterned support/interface layer 350 further comprises at least a trench 370 such that a top surface 372 of the dielectric layer 310 is exposed to the surrounding ambient and is the bottom wall 372 of the trench 370.

Next, in one embodiment, a bump limiting metallurgy (BLM) film 340 is formed on top of the entire structure 300 by, illustratively, sputter deposition. Illustratively, the BLM film 340 comprises multiple layers of copper, chrome (Cr), and gold (Au).

Figure 3B:
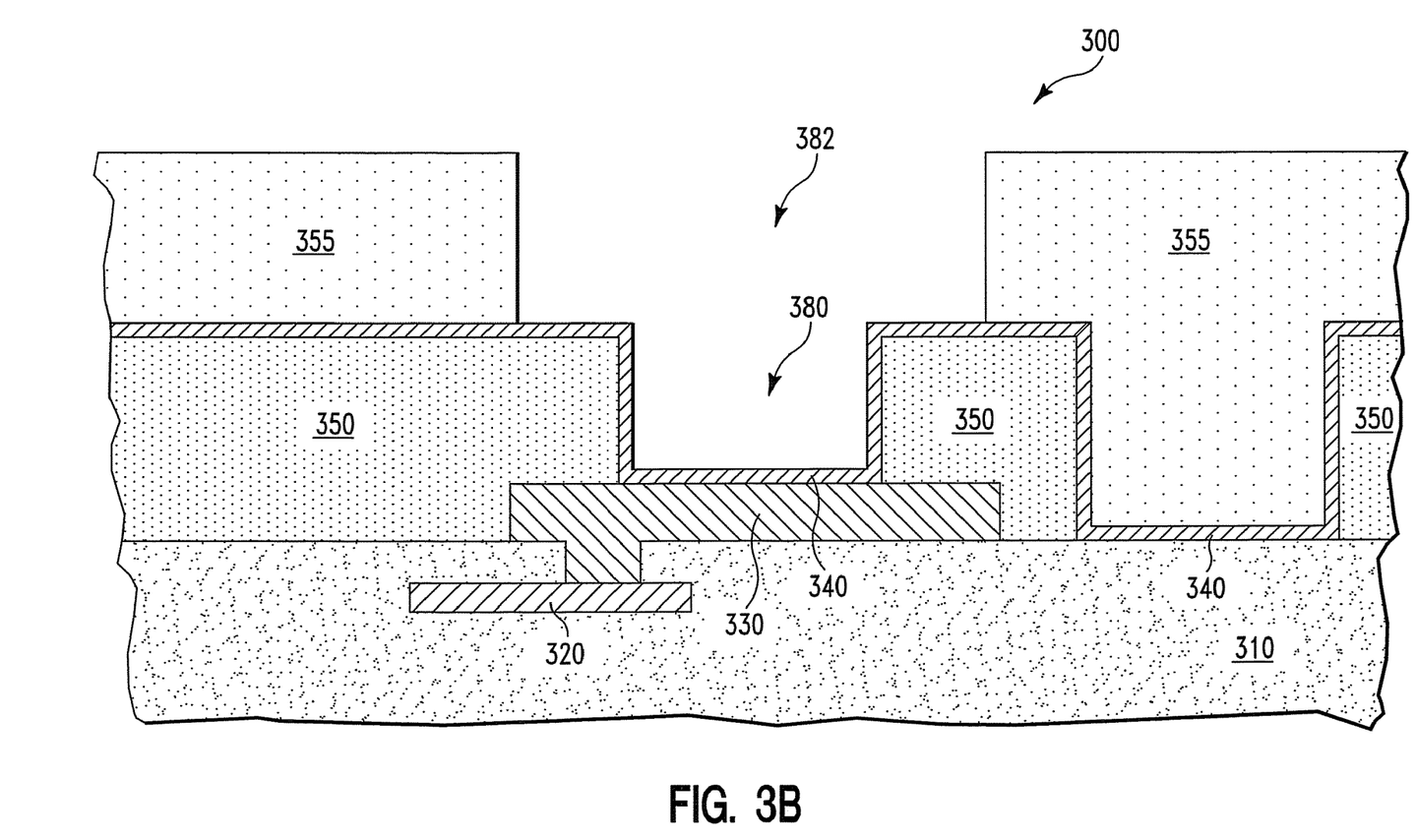

Next, with reference to FIG. 3B, in one embodiment, a patterned photoresist layer 355 is formed on top of the structure 300 by, illustratively, a photo lithographic process. The patterned photoresist layer 355 comprises a hole 382 directly above the Al bond pad 130. In one embodiment, the hole 382 is aligned with and wider than the hole 380 of the patterned support/interface layer 350.

Figure 3C:
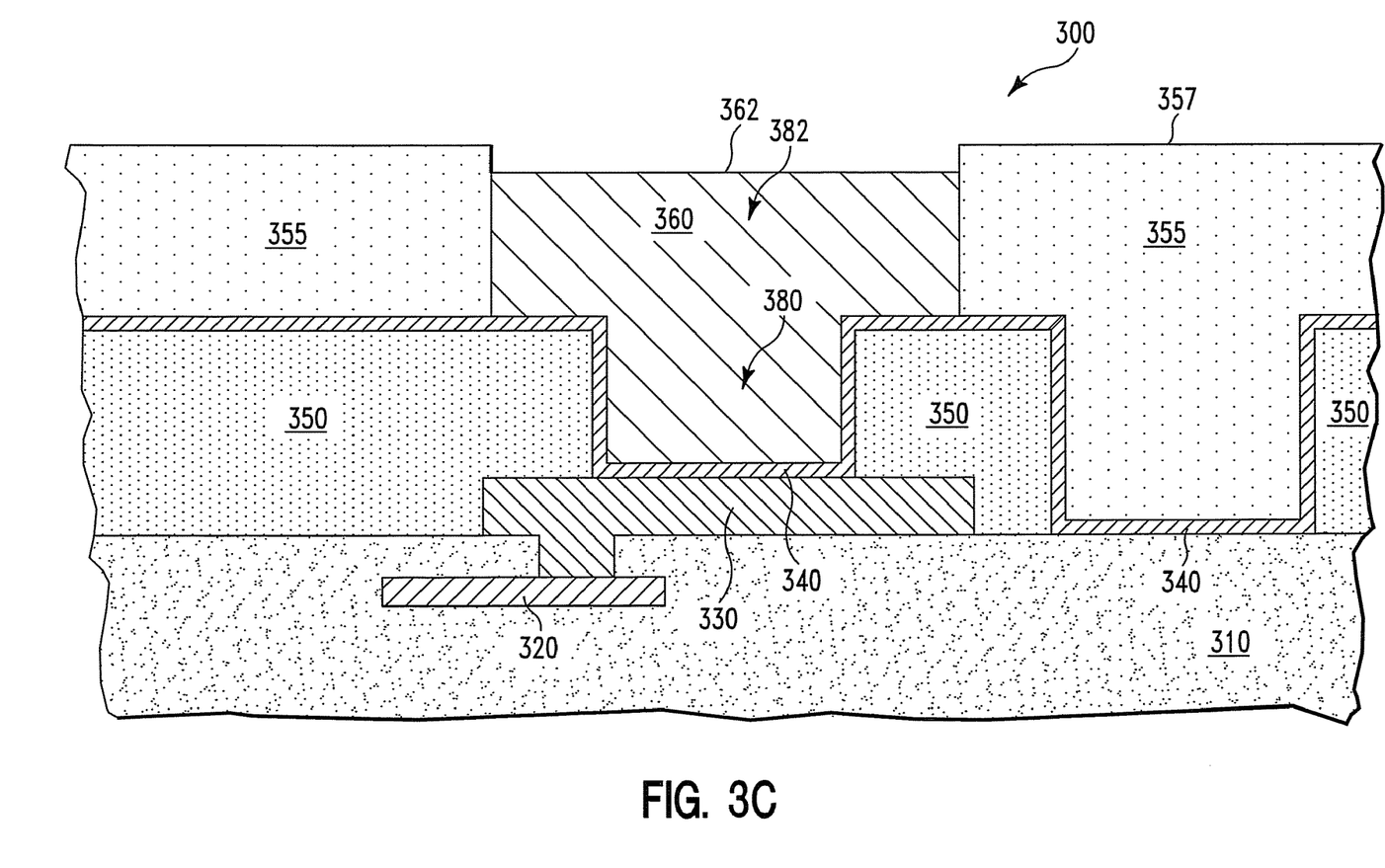

Next, with reference to FIG. 3C, in one embodiment, a solder bump 360 (comprising lead (Pb) and tin (Sn) in one embodiment) is formed in the holes 380 and 382 by, illustratively, electroplating. In one embodiment, the solder bump 360 is formed such that its top surface 362 is at a lower level than a top surface 357 of the patterned photoresist layer 355. Alternatively, the solder bump 360 is formed such that its top surface 362 is at a higher level than the top surface 357 of the patterned support/interface layer 350.

Figure 3D:
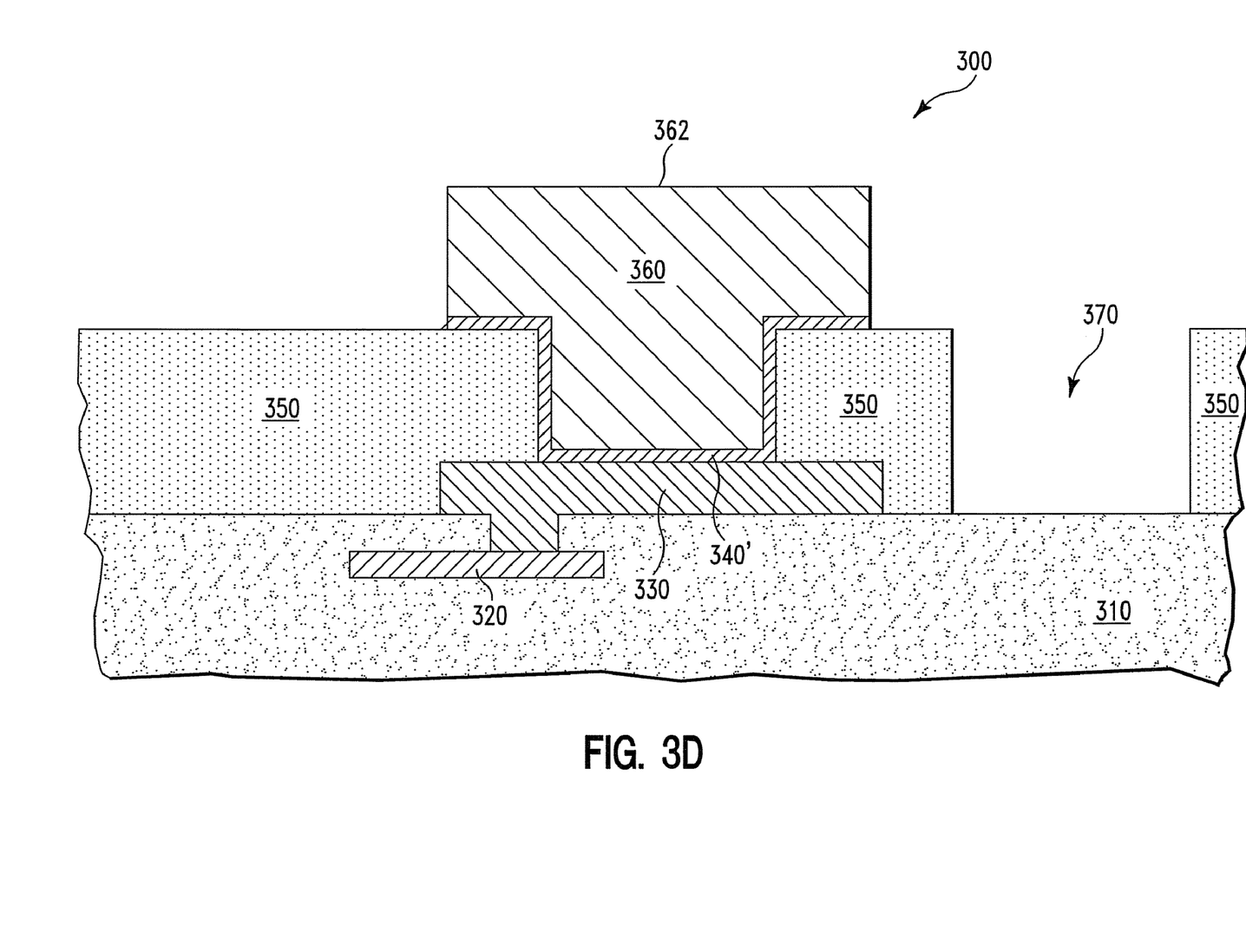

Next, in one embodiment, the patterned photoresist layer 355 is completely removed. Then, the BLM film 340 is etched by, illustratively, a plasma etch process such that what remains of the BLM film 340 is a BLM region 340' (FIG. 3D) sandwiched (a) between the solder bump 360 and the patterned support/interface layer 350 and (b) between the solder bump 360 and the Al bond pad 330. The resultant structure 300 is shown in FIG. 3D.

Figure 3E:
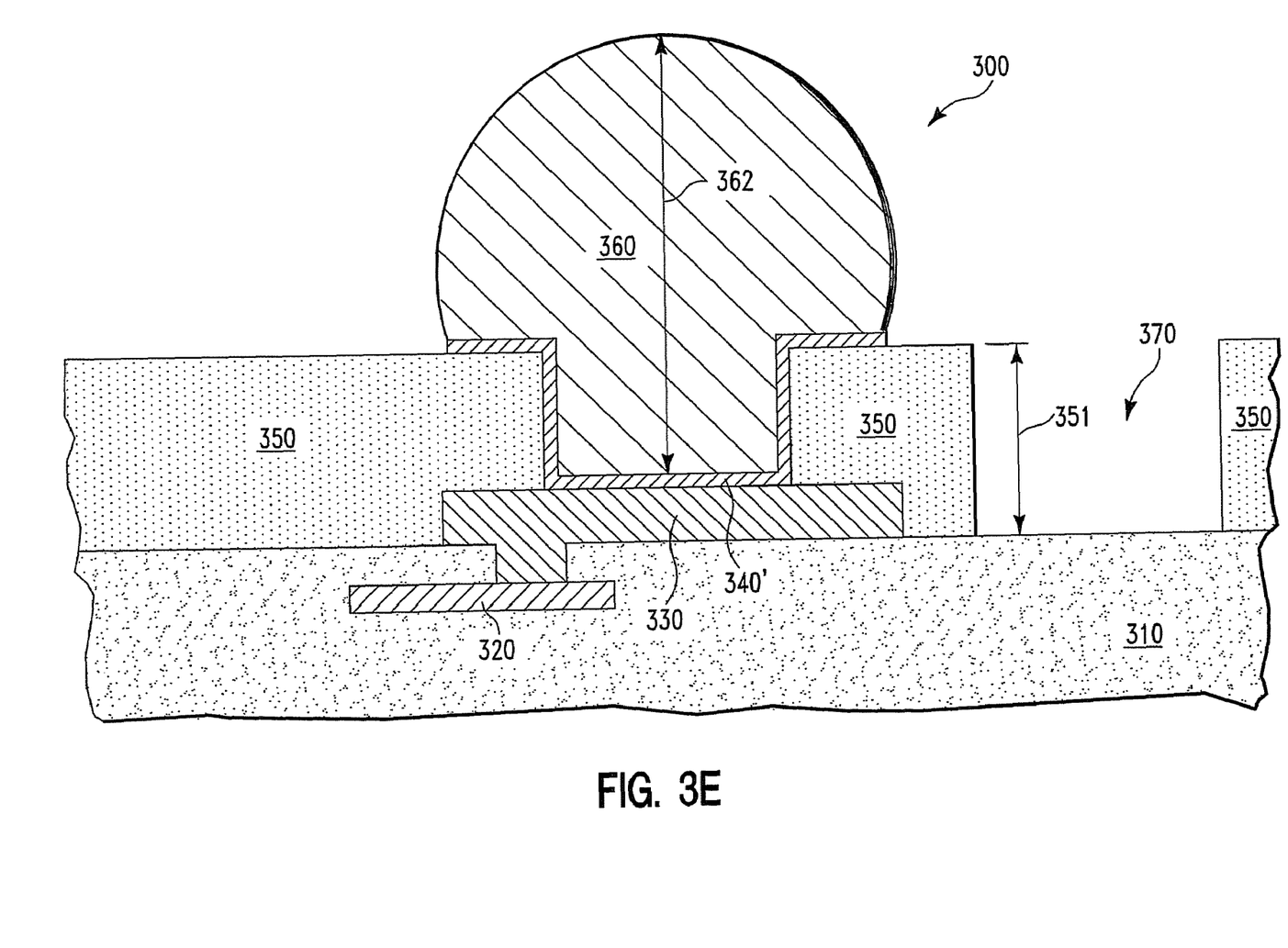

Next, with reference to FIG. 3E, in one embodiment, the solder bump 360 is reflowed so as to have a spherical shape at its top portion. Illustratively, the solder bump 360 of FIG. 1D is reflowed by subjecting it to a temperature lower than 400° C. In one embodiment, the resulting solder bump 360 has a height 362 in a range of 100-125 μm, and the patterned support/interface layer 350 has a height 351 in a range of 30-50 μm.

In one embodiment, the thickness 351 of the patterned support/interface layer 350 is at least ⅓ the height 362 of the resultant solder bump 360. As a result, the solder bump 360 has a strong cushion support by the patterned support/interface layer 350.

In one embodiment, additional structures (not shown) similar to the structure 300 of FIG. 3E are formed at top of the semiconductor chip. These additional structures may share the same patterned support/interface layer 350 with the structure 300. In one embodiment, the additional structures and the structure 300 are simultaneously formed at top of the semiconductor chip. After that, in one embodiment, the chip is flipped face down and aligned to a package/substrate (not shown). The solder bumps of the chip are bonded directly, simultaneously, and one-to-one to the pads (not shown) of the package/substrate (called package/substrate pads). After that, an adhesive underfill material is used to fill the empty space between the chip and the package/substrate including the trench 370 and the trenches of the additional structures (similar to the trench 370). Once in place, the adhesive underfill material is cured at a high temperature so as to become a solid underfill layer (not shown) that tightly couples the chip to the package/substrate. The trenches of the additional structures (similar to the trench 370) and the trench 370 help make a top surface (not shown) of the chip rougher resulting in a strong bond between the chip and the solid underfill layer.

Similarly, with reference to FIG. 1E, in one embodiment, additional structures (not shown) similar to the structure 100 are formed at top of the semiconductor chip. These additional structures may share the same patterned support/interface layer 150. In one embodiment, the additional structures and the structure 100 are simultaneously formed at top of the semiconductor chip.

Similarly, with reference to FIG. 2C, in one embodiment, additional structures (not shown) similar to the structure 200 are formed at top of the semiconductor chip. These additional structures may share the same patterned support/interface layer 250. In one embodiment, the additional structures and the structure 200 are simultaneously formed at top of the semiconductor chip.

With reference to FIGS. 1E, 2C, and 3E, the structures 100 and 200 are similar to the structure 300 in the following aspects. First, the solder bumps 100 and 200 also have strong support from the support/interface portion 154 and the patterned support/interface layer 250, respectively, just like the solder bump 360 has strong support from the patterned support/interface layer 350. Second, if additional structures similar to the structure 100 and 200 are formed at top of the chip, then trenches are formed in the associated patterned support/interface layer making the chip surface (not shown) rough. As a result, when the chip is flipped and attached to the package/substrate and then an adhesive underfill material is used to fill the empty space between the chip and the package/substrate, the adhesive underfill material will bond tightly to the rough chip surface. Therefore, when cured, the adhesive underfill material will form the resultant solid underfill layer that forms a strong bond to the chip.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A structure formation method, comprising:
   providing (a) a dielectric layer including a dielectric layer top surface that defines a reference direction essentially perpendicular to the dielectric layer top surface, and (b) an electrically conductive bond pad on and in direct physical contact with the dielectric layer top surface;
   forming a bump limiting metallurgy (BLM) film on the electrically conductive bond pad and the dielectric layer top surface;
   forming a patterned support/interface layer on the BLM film, wherein the patterned support/interface layer comprises a hole directly above the electrically conductive bond pad such that the BLM film is exposed to a surrounding ambient through the hole;
   forming an electrically conductive solder bump in the hole and in direct physical contact with the BLM film, wherein the electrically conductive solder bump has a top point at a level higher than a top surface of the patterned support/interface layer; and
   using the electrically conductive solder bump as a blocking mask to etch the patterned support/interface layer and then the BLM film stopping at the dielectric layer so as to form a support/interface region from the patterned support/interface layer,
   wherein the support/interface region is in direct physical contact with the electrically conductive solder bump.

2. The method of claim 1, further comprising forming another electrically conductive solder bump (i) in another hole of the patterned support/interface layer and (ii) in direct physical contact with the BLM film,
   wherein the another electrically conductive solder bump has a top point at a level higher than a top surface of the patterned support/interface layer.

3. A structure formation method, comprising:
   providing (a) a dielectric layer including a dielectric layer top surface that defines a reference direction essentially perpendicular to the dielectric layer top surface, and (b) an electrically conductive bond pad on and in direct physical contact with the dielectric layer top surface;
   forming a bump limiting metallurgy (BLM) film on the electrically conductive bond pad and the dielectric layer top surface;
   forming a patterned support/interface layer on the BLM film, wherein the patterned support/interface layer comprises a hole directly above the electrically conductive bond pad such that the BLM film is exposed to a surrounding ambient through the hole;
   forming an electrically conductive solder bump in the hole and in direct physical contact with the BLM film,
      wherein the electrically conductive solder bump has a top point at a level higher than a top surface of the patterned support/interface layer,
      wherein the patterned support/interface layer comprises a trench, and
      wherein portions of the BLM film directly beneath the trench is not exposed to the surrounding ambient; and
   etching the patterned support/interface layer and then the BLM film in the trench to make the trench deeper so as to physically isolate a BLM region of the BLM film from a remainder of the BLM film,
   wherein the BLM region is in direct physical contact with the electrically conductive solder bump.

* * * * *